United States Patent
Shi et al.

(10) Patent No.: US 7,009,142 B2
(45) Date of Patent: Mar. 7, 2006

(54) SYSTEM AND METHOD FOR JOINING FLAT FLEXIBLE CABLES

(75) Inventors: Zhong-You (Joe) Shi, Ann Arbor, MI (US); Peter J. Sinkunas, Canton, MI (US)

(73) Assignee: Visteon Global Technologies Inc., Dearborn, MI (US)

( * ) Notice: Subject to any disclaimer, the term of this patent is extended or adjusted under 35 U.S.C. 154(b) by 76 days.

(21) Appl. No.: 10/850,223

(22) Filed: May 20, 2004

(65) Prior Publication Data

US 2005/0258153 A1    Nov. 24, 2005

(51) Int. Cl.
*B23K 26/00*    (2006.01)
(52) U.S. Cl. ............................ 219/121.85; 219/121.65; 219/121.66
(58) Field of Classification Search .......... 219/121.85, 219/121.65, 121.66, 121.82, 121.6; 228/13, 228/33, 177, 178
See application file for complete search history.

(56) References Cited

U.S. PATENT DOCUMENTS

| 4,547,652 | A |   | 10/1985 | Raisig et al. |
| 4,931,616 | A | * | 6/1990 | Usui et al. ............. 219/121.68 |
| 5,272,307 | A |   | 12/1993 | Jones |
| 5,314,346 | A |   | 5/1994 | Owens et al. |
| 5,676,865 | A | * | 10/1997 | Chang ................... 219/121.64 |
| 5,971,251 | A | * | 10/1999 | Moore et al. ............ 228/112.1 |
| 6,072,148 | A |   | 6/2000 | Azdasht |
| 6,501,043 | B1 |  | 12/2002 | Ruben |
| 2003/0019846 | A1 | | 1/2003 | Sinkunas et al. |
| 2003/0146018 | A1 | | 8/2003 | Sinkunas et al. |

FOREIGN PATENT DOCUMENTS

| EP | 1 256 408 A1 | 11/2002 |
| JP | 04137795 | 5/1992 |
| JP | 62-28068 | 8/1994 |

OTHER PUBLICATIONS

English Translation of JP 41137795.
English Translation of JP 62-28068.

* cited by examiner

*Primary Examiner*—M. Alexandra Elve
(74) *Attorney, Agent, or Firm*—Brinks Hofer Gilson & Lione

(57) ABSTRACT

A method for interconnecting flat cable is disclosed. The flat cable has a plurality of conductors attached to an insulating layer. The method includes removing an insulation layer from a first and second flat cable portions to expose the plurality of conductors, applying a thermal plate to the exposed plurality of conductors of the first flat cable portion, applying solder to first flat cable portion, placing the plurality of conductors of second flat cable portion over the plurality of conductors of first flat cable portion having applied solder, applying a transparent plate over the first and second flat cable portions, scanning a laser beam through the transparent plate to reflow the solder between the first and second flat cable portions.

18 Claims, 3 Drawing Sheets

SYSTEM AND METHOD FOR JOINING FLAT FLEXIBLE CABLES

TECHNICAL FIELD

The present invention relates to systems and methods for electrically interconnecting flat flexible cable. Typically, the electrical interconnection is accomplished through a soldering process.

BACKGROUND

Flat flexible cable (FFC) is typically made of a plastic substrate having a plurality of copper conductors or the like mounted or attached to the plastic substrate. Generally, the plastic substrate and copper conductor assembly is flat and flexible. The copper conductors can vary in width and thickness depending on the current carrying capacity requirements. Many types of plastic have been used to form the plastic substrate such as polypropylene, Mylar, polyurethane and the like. FFC has many advantages over the conventional round wire harnesses or assemblies. For example, FFC takes up less volume, weighs less and increases the robustness of the electronic assembly. Further, the cost of manufacturing FFC is lower than the cost of manufacturing round wire harnesses. FFC can be constructed in multiple layers and fit in very confined areas such as within an instrument panel or an engine compartment of a vehicle. Packaging of FFC within a vehicle is particularly important as vehicles have very limited space and the number of electronic packages and wire harnesses are increasing and competing for that limited space.

One significant problem confronting designers of FFC systems is that FFC is not structurally stable at soldering temperatures. Thus, FFC may not be easily soldered using conventional soldering methods. Such conventional soldering methods can damage the plastic insulating materials.

Therefore, there is a need for a new and improved system and method for interconnecting the conductors of an FFC. The method should not structurally damage the plastic insulating layer; however the method should provide a metallurgical interconnection between conductors of two adjoining FFCs.

SUMMARY

In an aspect of the present invention a method for interconnecting flat cable, the flat cable having a plurality of conductors attached to an insulating layer is provided. The method includes removing the insulation layer from first and second flat cable portions to expose the plurality of conductors, applying a thermal plate to the exposed plurality of conductors of the first flat cable portion, applying solder to first flat cable portion, placing the plurality of conductors of the second flat cable portion in contact with the plurality of conductors of first flat cable portion having the applied solder, positioning a transparent plate over the conductors of first and second flat cable portions, and scanning a laser beam over and through the transparent plate to reflow the solder between the first and second flat cable portions, wherein an electrical interconnection between the first and second flat cable portions is formed.

In another aspect of the present invention the method further includes removing a top insulation layer covering a top surface of the plurality of conductors and removing a bottom insulation layer covering a bottom surface of the plurality of conductors.

In another aspect of the present invention the method further includes applying the thermal plate to a bottom surface of the exposed plurality of conductors.

In still another aspect of the present invention the method further includes applying a solder paste to the top surface of the plurality of conductors of the first flat cable portion.

In still another aspect of the present invention the method further includes applying a ceramic plate against a surface of the plurality of conductors of the first flat cable portion.

In still another aspect of the present invention the method further includes holding the plurality of conductors of the second flat cable portion against the plurality of conductors of the first flat cable portion using a hold down blade.

In still another aspect of the present invention the method further includes thermally welding the thermal plate to the transparent plate.

In yet another aspect of the present invention a system for interconnecting flat cable, the flat cable having a plurality of conductors attached to an insulating layer and wherein the insulation layer is removed the from first and second flat cable portions to expose the plurality of conductors is provided. The system includes a thermal plate, a solder, a transparent plate and a laser beam. The thermal plate is applied to a first side of the exposed plurality of conductors of the first flat cable portion. The solder is applied to a second side of the exposed plurality of conductors of the first flat cable portion, wherein the plurality of conductors of the second flat cable portion is placed in contact with the plurality of conductors of first flat cable portion having the applied solder. The transparent plate is positioned over the plurality of conductors of first and second flat cable portions. The laser beam is scanned across and through the transparent plate to reflow the solder between the first and second flat cable portions to form an electrical interconnection between the first and second flat cable portions.

These and other aspects and advantages of the present invention will become apparent upon reading the following detailed description of the invention in combination with the accompanying drawings.

DESCRIPTION

Figure 1:
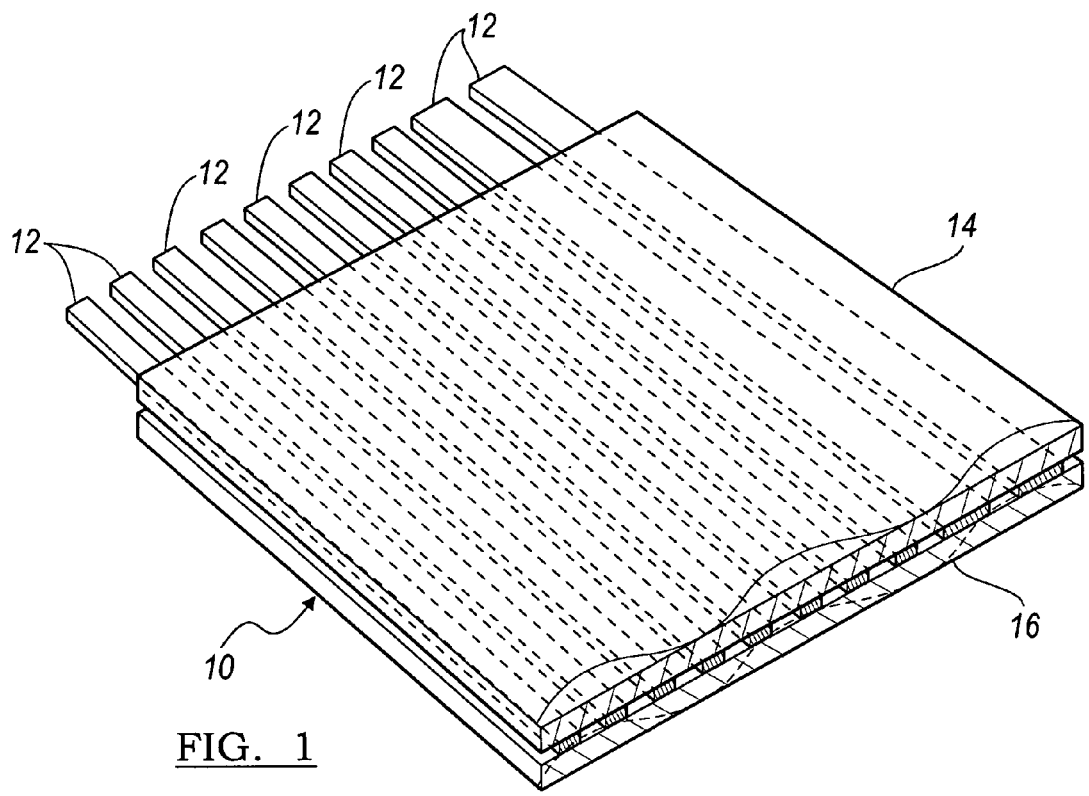
FIG. 1 is a perspective view of a first portion of a flat flexible cable having exposed conductors, in accordance with an embodiment of the present invention.

Referring now to FIG. 1, a first portion of a flat flexible cable (FFC) 10 is illustrated, in accordance with an embodiment of the present invention. The first portion of flat flexible cable 10 includes a plurality of conductors 12 and insulating substrate layers 14 and 16. The plurality of conductors 12 may be made of a copper or other suitable conductive material. Conductors 12 are generally flat, having relatively narrow widths and extend longitudinally at desired lengths. The width of conductors 12 varies depending on the voltage or current carrying capacity requirements. Further, the thickness dimension of conductors 12 is quite small relative to the width of the conductors and may also vary along with the width to satisfy given electrical requirements.

Insulating substrate layers 14 and 16 are disposed on either side of conductors 12 and may include an adhesive layer (not shown) disposed on the surfaces that abut conductors 12. Insulating substrate layers 14 and 16 are generally made of a polypropylene, PET, polyurethane or similar plastic. Generally, insulating substrate layers 14, 16 and conductors 12 when assembled, form a flat flexible cable. Flat flexible cable 10 may be joined to electronic devices or other FFC and used in a variety of applications that require electrical cable that is packageable in areas where space is scarce.

Figure 2:
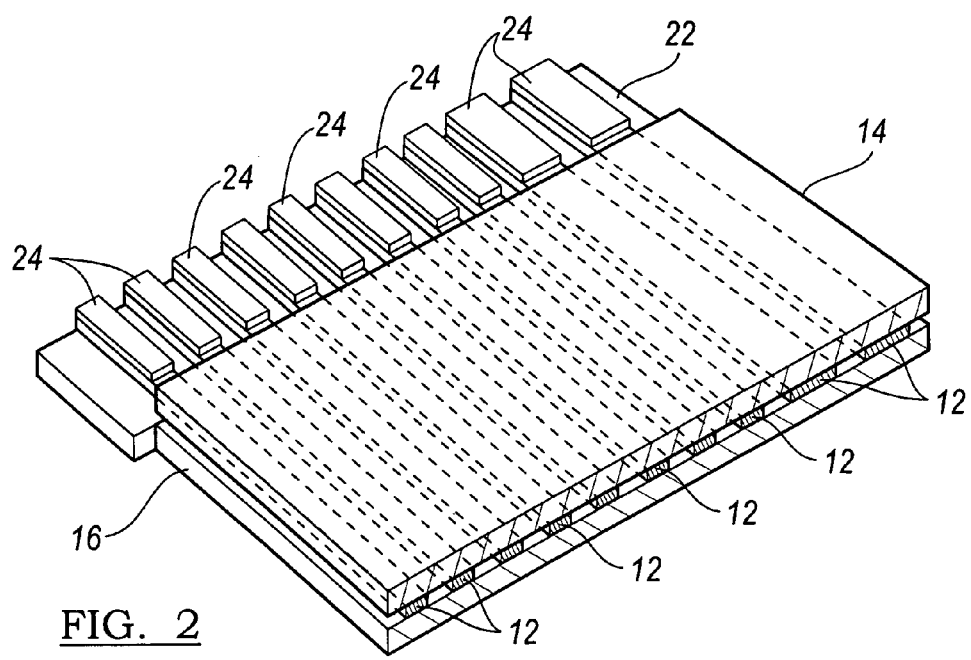
FIG. 2 is a perspective view of a first portion of flat flexible cable having solder disposed on the exposed conductors with a thermal resistant plate applied to an underside of the conductors, in accordance with an embodiment of the present invention.

Referring now to FIG. 2, first FFC portion 10 is illustrated with a thermal resistant plate 22 applied to a surface of conductors 12. Thermal resistant plate 22 is applied or placed under and abutting the bottom surfaces of the plurality of conductors 12. Thermal resistant plate 22 may be made of a ceramic material, plastic or any suitable material that is thermally resistant and thermally insulating. Thermal plate 22 should have sufficient thermal properties such that the plate can withstand high temperatures, especially temperatures reached during a soldering process and remain structurally stable. With thermal plate 22 supporting conductors 12, solder 24 is applied to surfaces of conductors 12 (i.e., top surfaces). Solder 24 may be applied as a paste, as a solder preform with flux, a solder wire core with flux, or a solder paste sausage or the like. Various techniques are used to apply solder paste to conductors 12. For example, solder paste 24 may be applied using a stencil. In other embodiments of the present invention, the solder preform, solder wire core or solder paste sausage is laid or deposited over top of conductors 12.

In an embodiment of the present invention, systems and methods are provided for joining the FFC described above. In order to join first FFC portion 10 to a similar second FFC portion 20, first FFC portion 10 must be prepared as follows. The insulating substrate layers 14 and 16 are removed from the top surface and bottom surfaces of conductors 12. Thus, conductors 12 are now exposed and extend a predefined distance longitudinally from insulating substrate layers 14 and 16.

Figure 3:
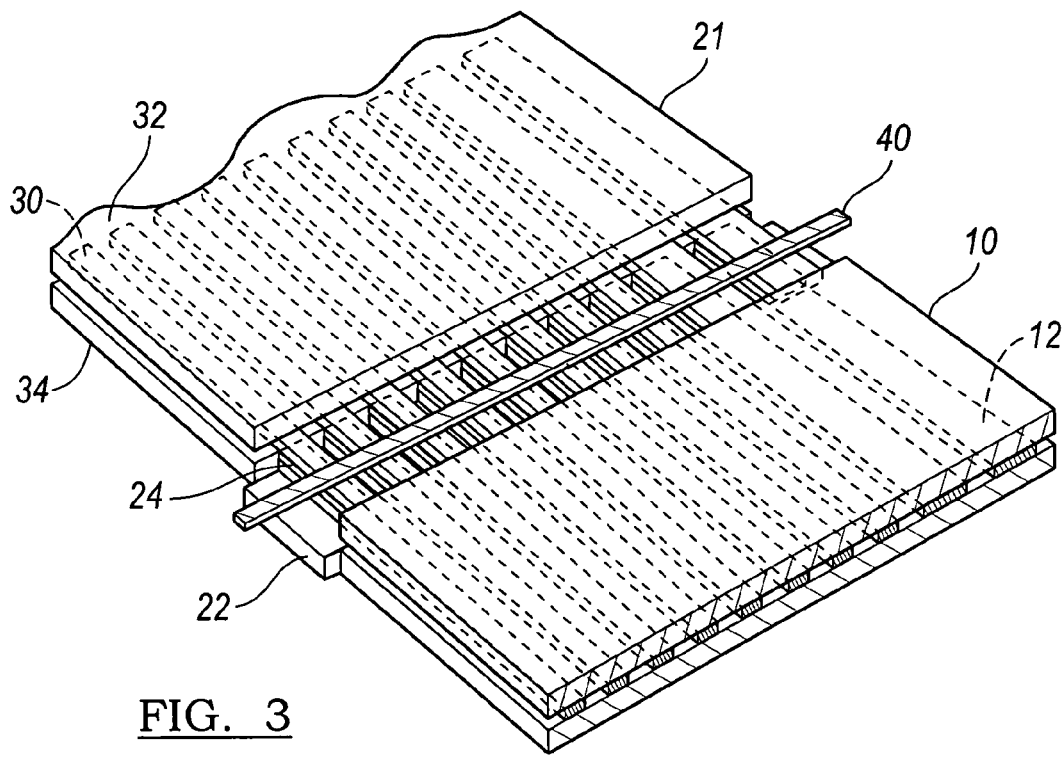
FIG. 3 is a perspective view of first and second portion of a flat flexible cable having exposed conductors adjacent each other and held in place with a hold down blade, in accordance with an embodiment of the present invention.

Referring now to FIG. 3, a method for forming an electrical joint between the first and second FFC portions 10, 20 is illustrated, in accordance with an embodiment of the present invention. Second FFC portion 20 is constructed in a similar manner as first FFC portion 10 and thus includes a plurality of conductors 30 and at least two insulating substrate layers 32 and 34. As with first FFC portion 10, insulating substrate layers 32, 34 are disposed on either side of conductors 30 forming a flat flexible cable 20. First FFC portion 10 and second FCC portion 20 are joined together by reflowing solder disposed between the plurality of conductors 12 and 30 in each of the first and second FFC portions 10, 20. As discussed previously, first FFC portion 10 is prepared for soldering by first removing insulating substrate layers 14 and 16 from either side conductors 12. In order to join second FFC portion 20 with first FFC portion 10, the insulating substrate layers 32 and 34 are removed from the top and bottom surfaces of conductors 30 in a similar manner as performed on first FFC portion 10. The now exposed conductors 30 are overlaid on top of conductors 12 having solder 24 and supported by thermal resistant plate 22. A hold down blade 40 is applied to the top surface of conductors 30 to stabilize, fix and press conductors 30 against conductors 12.

Figure 4:
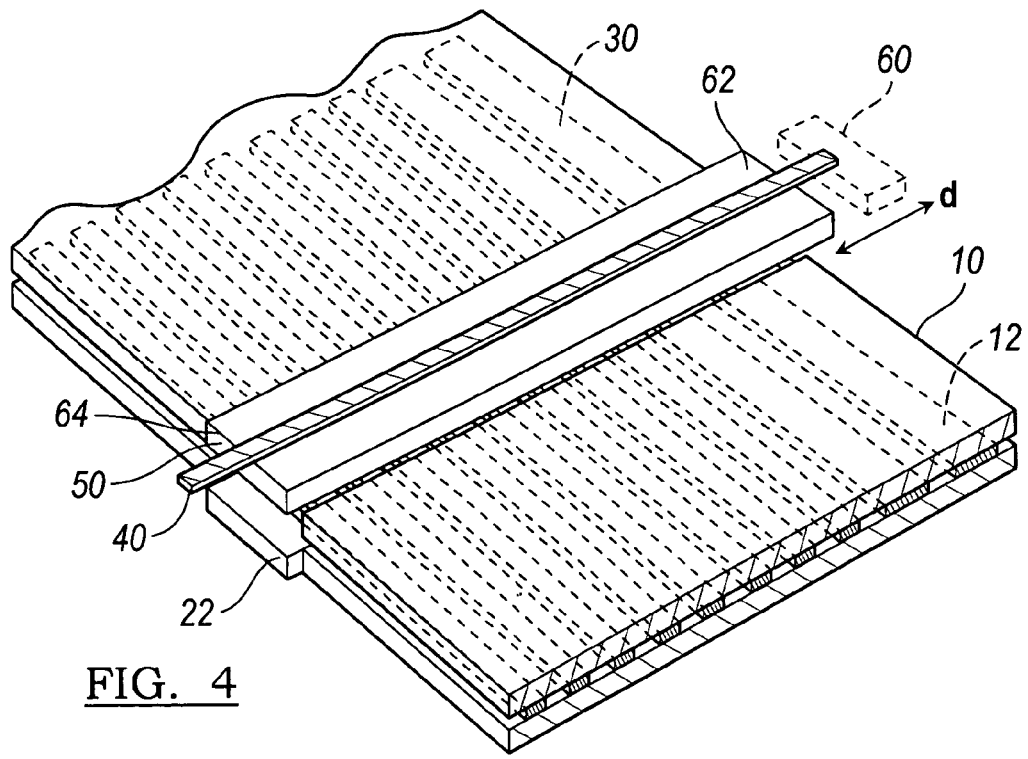
FIG. 4 is a perspective view of first and second portions of flat flexible cable having solder disposed on the exposed conductors with a thermal resistant plate applied to an underside of the conductors and a transparent plate applied to the topside of the conductors, in accordance with an embodiment of the present invention.

Referring now to FIG. 4, mated first and second FFC portions 10 and 20 are illustrated, in accordance with the present invention. Hold down blade 40 is released from the top surfaces of conductors 30 and a transparent plate 50 is placed over top of conductors 30. Blade 40 is then applied to the top surface of plate 50. Plate 50 is a transparent plate which may be made of a glass, plastic or similar transparent material. Blade 40 presses plate 50 against conductors 30 forcing the conductors against solder 24 and toward conductors 12. Thus, blade 40 and plate 50 ensure good mechanical contact is achieved between the solder 24 and copper conductors 12, 30.

With continuing reference to FIG. 4, a method for electrically interconnecting FFC portions 10 and 20 is illustrated, in accordance with an embodiment of the present invention. A laser beam, represented by block 60, is initially positioned at an edge 62 of transparent plate 50. Laser beam 60 has a predefined laser spot size. In operation, laser beam 60 is scanned over transparent plate 50 in a direction as indicated by arrow D and toward edge 64 of plate 50. The scanning rate of laser beam 60 across transparent plate 50 of course can be varied depending on the solder and conductor configurations. After laser beam 60 has completed the scanning process and the solder paste has been reflowed to form an electrical interconnection between conductors 12 and 30, thermal resistant plate 22 and transparent plate 50 may be removed from FFC portions 10, 20. If desired an electrical insulating tape or other cover may be applied to conductors 12 and 30 of FFC portions 10, 20.

Figure 5:
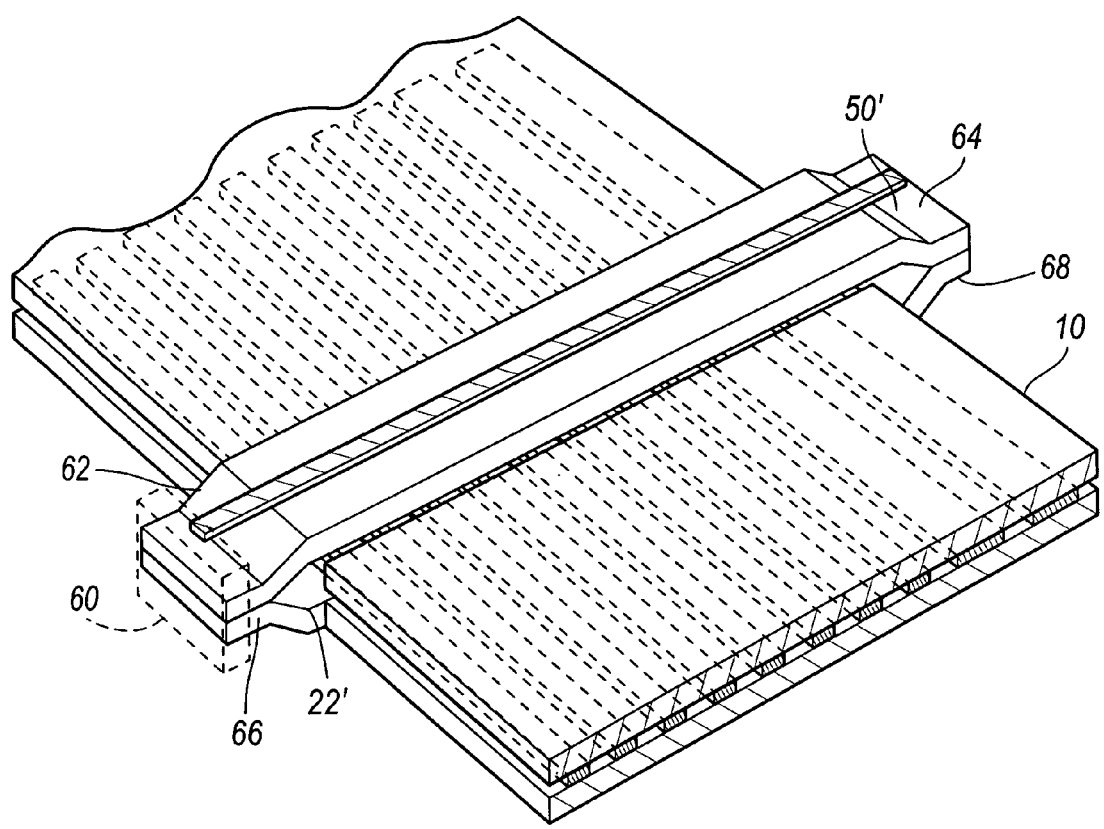
FIG. 5 is a perspective view of first and second portions of a flat flexible cable having conductor soldered together and a transparent plate welded to a thermal plate, in accordance with an embodiment of the present invention.

Referring now to FIG. 5, an alternative embodiment of a system and method for joining two portions of a flat flexible cable is illustrated. Flat flexible cable portions 10 and 20 may be joined as previously described, however, with a different configuration of thermal resistant plate 22. More specifically, thermal resistant plate 22 is made of a dark material such as a dark plastic to form a dark or opaque thermal resistant plate 22'. In operation, laser beam 60 is scanned over transparent plate 50' and dark thermal resistant plate 22' a sufficient amount of time to reflow the solder disposed therebetween. The ends 62 and 64 of plate 50' may be welded to the ends 66 and 68 of plate 22' by scanning laser beam 60 over the ends until sufficient energy is transferred to the plates to weld same. The welding of plate 50' to plate 22' occurs by the absorption of energy from laser beam 60 into thermal plastic plate 22'. As plate 22' absorbs energy from laser beam 60, plate 22' increases in temperature and is thermally welded to plate 50'. Depending on the pitch of the conductors, plates 50' and 22' may also be joined at locations between each of the conductors 12, 30.

As any person skilled in the art of interconnecting flat flexible cable will recognize from the previous detailed description and from the figures and claims, modifications and changes can be made to the preferred embodiments of the invention without departing from the scope of this invention defined in the following claims.

We claim:

1. A method for interconnecting flat cable, the flat cable having a plurality of conductors attached to an insulating layer, the method comprising:
   removing the insulation layer from first and second flat cable portions to expose the plurality of conductors;
   applying a thermal plate to the exposed plurality of conductors of the first flat cable portion;
   applying solder to first flat cable portion;
   placing the plurality of conductors of the second flat cable portion in contact with the plurality of conductors of first flat cable portion having the applied solder;
   positioning a transparent plate over the conductors of first and second flat cable portions; and
   scanning a laser beam over and through the transparent plate to reflow the solder between the first and second flat cable portions, wherein an electrical interconnection between the first and second flat cable portions is formed.

2. The method of claim 1 wherein removing an insulation layer from a first and second flat cable portions further comprising removing a top insulation layer covering a top surface of the plurality of conductors and removing a bottom insulation layer covering a bottom surface of the plurality of conductors.

3. The method of claim 1 wherein applying a thermal plate to the exposed plurality of conductors further comprises applying the thermal plate to a bottom surface of the exposed plurality of conductors.

4. The method of claim 1 wherein applying solder to first flat cable portion further comprises applying a solder paste to the top surface of the plurality of conductors of the first flat cable portion.

5. The method of claim 1 wherein applying a thermal plate further comprises applying a ceramic plate against a surface of the plurality of conductors of the first flat cable portion.

6. The method of claim 1 further comprising holding the plurality of conductors of the second flat cable portion against the plurality of conductors of the first flat cable portion using a hold down blade.

7. The method of claim 1 further comprising thermally welding the thermal plate to the transparent plate.

8. The method of claim 7 wherein thermally welding further comprises providing a thermal plate that is opaque.

9. The method of claim 7 wherein thermally welding further comprises welding an end of the thermal plate to an end of the transparent plate.

10. A system for interconnecting flat cable, the flat cable having a plurality of conductors attached to an insulating layer and wherein the insulation layer is removed from first and second flat cable portions to expose the plurality of conductors, the system comprising:
    a thermal plate applied to a first side of the exposed plurality of conductors of the first flat cable portion;
    a solder applied to a second side of the exposed plurality of conductors of the first flat cable portion, wherein the plurality of conductors of the second flat cable portion is placed in contact with the plurality of conductors of first flat cable portion having the applied solder;
    a transparent plate positioned over the plurality of conductors of first and second flat cable portions; and
    a laser beam for scanning across and through the transparent plate to reflow the solder between the first and second flat cable portions to form an electrical interconnection between the first and second flat cable portions.

11. The system of claim 10 wherein the thermal plate is a ceramic plate.

12. The system of claim 10 wherein the solder is a preformed solder paste that is placed on the second side of first flat cable portion of the plurality of conductors.

13. The system of claim 10 wherein the thermal plate is opaque.

14. The system of claim 10 further comprising a hold down blade for holding the plurality of conductors of the second flat cable portion against the plurality of conductors of the first flat cable portion.

15. The system of claim 10 wherein the thermal plate is the same length as the transparent plate.

16. The system of claim 10 wherein the thermal plate is welded to the transparent plate.

17. The system of claim 16 wherein an end of the thermal plate is welded to an end of the transparent plate.

18. The system of claim 16 wherein an intermediate portion of the thermal plate is welded to an intermediate portion of the transparent plate.

* * * * *